(12) United States Patent  
Campardo (10) Patent No.: US 7,675,788 B2
(45) Date of Patent: Mar. 9, 2010

(54) ELECTRONIC NON-VOLATILE MEMORY DEVICE HAVING A CNAND STRUCTURE AND BEING MONOLITHICALLY INTEGRATED ON SEMICONDUCTOR

(76) Inventor: Giovanni Campardo, Via Rillosi, 9, I-24100, Bergamo (IT)

( * ) Notice: Subject to any disclaimer, the term of this patent is extended or adjusted under 35 U.S.C. 154(b) by 151 days.

(21) Appl. No.: 11/401,521

(22) Filed: Apr. 11, 2006

(65) Prior Publication Data

US 2006/0250847 A1    Nov. 9, 2006

(30) Foreign Application Priority Data

Apr. 11, 2005    (IT)    ............... MI2005A0608

(51) Int. Cl.
*G11C 16/04*    (2006.01)
(52) U.S. Cl. ............... 365/185.33; 365/185.17; 365/185.23
(58) Field of Classification Search ............ 365/185.11, 365/185.17, 185.19, 185.24, 185.25, 185.33
See application file for complete search history.

(56) References Cited

U.S. PATENT DOCUMENTS

| 5,553,016 | A | 9/1996 | Takebuchi | 365/51 |
| 5,777,925 | A | 7/1998 | Tokushige | 365/185.11 |
| 6,032,248 | A | 2/2000 | Curry et al. | 712/37 |
| 6,175,523 | B1* | 1/2001 | Yang et al. | 365/185.25 |
| 6,801,458 | B2* | 10/2004 | Sakui et al. | 365/185.24 |
| 7,099,200 | B2* | 8/2006 | Sakui | 365/185.33 |
| 7,274,594 | B2* | 9/2007 | Pascucci et al. | 365/185.11 |
| 7,295,472 | B2* | 11/2007 | Pascucci et al. | 365/185.17 |
| 2002/0186591 | A1 | 12/2002 | Lee et al. | 365/185.17 |
| 2003/0128584 | A1 | 7/2003 | Shiromoto et al. | 365/185.05 |
| 2004/0238880 | A1 | 12/2004 | Nagasaka et al. | 257/316 |
| 2004/0240273 | A1* | 12/2004 | Sakui | 365/185.33 |
| 2007/0002630 | A1* | 1/2007 | Gallo et al. | 365/185.19 |

* cited by examiner

*Primary Examiner*—Gene N. Auduong
(74) *Attorney, Agent, or Firm*—Trop, Pruner & Hu, P.C.

(57) ABSTRACT

A non-volatile electronic memory device may be monolithically integrated on a semiconductor and be of the Flash EEPROM type having a NAND architecture and including at least one memory matrix organized in rows and columns of memory cells. Advantageously, the matrix may include at least one portion having a different data storage capacity and a different access speed than another portion.

18 Claims, 5 Drawing Sheets

ELECTRONIC NON-VOLATILE MEMORY DEVICE HAVING A CNAND STRUCTURE AND BEING MONOLITHICALLY INTEGRATED ON SEMICONDUCTOR

FIELD OF THE INVENTION

The present invention relates to an electronic memory device being monolithically integrated on a semiconductor and of the Flash EEPROM type with a NAND architecture comprising at least one memory organized in rows and columns of memory cells.

BACKGROUND OF THE INVENTION

It is known that, at present, the market for nonvolatile memories, for example of the EEPROM or Flash EEPROM type, is developing and perhaps the most promising applications relate to the data storage field. Until a few years ago, such a market almost exclusively involved the consumer field of digital cameras, with the associated memory cards, or USB portable units, which are expansion mobile memories for personal computers. Therefore, the demand for these products by the consumer market has mainly turned to large capacity flash memories.

This trend seems to be even destined to increase during the next years by virtue of the newer and newer applications of portable electronic devices which require higher and higher memory capacity, for example, for digital cameras or for cell phones of the new generation operating, for example, according to the 3G or UMTS standard. These applications are completely compatible with the natural evolution of Flash memories if one considers that these memories are substantially solid state memory units with further advantages linked to their low power consumption, to their operational silence, and to their reduced space, etc.

The architectures of Flash memories can be substantially referred to two fundamental classes, the first of which relates to the traditional and widely tested NOR architectures, while the second relates to the most innovative and promising NAND architectures. The first ones used to contain the program code and the second ones to contain the data.

For the previously cited applications the most suitable flash architecture for the specifications of low power consumption, high density, high programming and/or erasing speed, is certainly the one of the NAND type. This kind of architecture exhibits obvious advantages with respect to NOR architectures. In particular the Flash memories with the NAND architecture are faster when managing great amounts of data to be recovered in a synchronous way and this makes them most suitable for being used in applications on portable electronic devices.

Since in data storage applications the need of a random access time is less important with respect to the case of "code storage" applications, the most significant feature of NOR architectures loses most of its importance to the advantage of the NAND architecture which allows treating, in a simple and fast way, large amounts of "synchronous" data in reading and programming. However, although having the characteristic of a fast data modify speed, these NAND memories do not allow a fast random access to the same, since they are directed to the reading of whole pages of at least 512 bytes, but not of single bytes.

To meet the growing needs of portable electronic devices it may be necessary to have, in the same memory, also an excellent random access time, such as to perform the code or the boot of the operative system or of the programs without the burdensome assistance of a RAM.

To better understand all the aspects it is to be remembered that the two typologies of memories are both of the floating gate type, i.e. with a portion of conductive material being overlapped onto a control gate and sealed in the oxide, everything arranged above the channel of a MOS device, in general of the N type. The realization and the operation of this type of structure is prior art and allows, by using potentials applied at the different terminals of the cell, to bring or to remove electrons from the floating gate, thus obtaining a modification of the threshold of the equivalent MOS transistor with which logic information can be associated. For example a logic "0" for the presence of electrons and a logic "1" for the absence.

The different architecture of a matrix realized with one or the other of the memory typologies makes the different electrical characteristics more clear. For example, it is important to remember that the reading, i.e. the interpretation of the information contained in the cell, occurs, even if with different modes, by verifying the current the cell is able to absorb.

Figure 1:
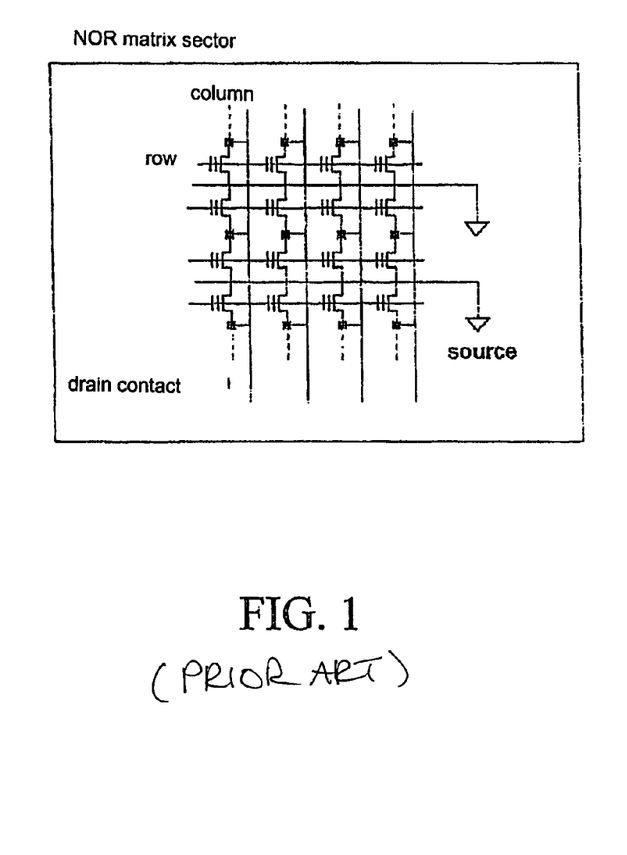
FIG. 1 shows a schematic view of an electronic memory device, in particular an EEPROM memory with a NOR architecture realized according to the prior art.

FIG. 1 shows, by way of example, the structure of a memory of the NOR type characterized in having a drain contact for each cell (in reality, due to space reasons, the contact is shared by two cells); this allows addressing the single cell. The cell reading which occurs as said based upon current, is obtained by biasing the cell and by verifying the current the same is able to absorb.

Figure 2:
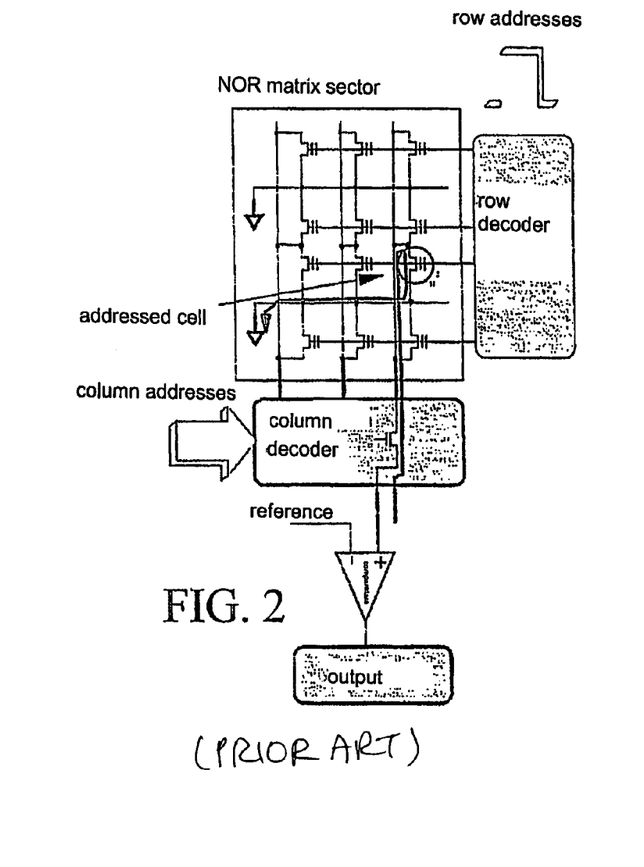
FIG. 2 shows a further schematic view of a detail of the electronic device of FIG. 1 in the reading step as in the prior art.

The arrangement of the cell in the matrix array makes the current to be measured be only for the addressed memory cell. In this way the reading operation uses all the current available and it is thus fast. FIG. 2 schematically shows this approach and also highlights the current flow.

Figure 3:
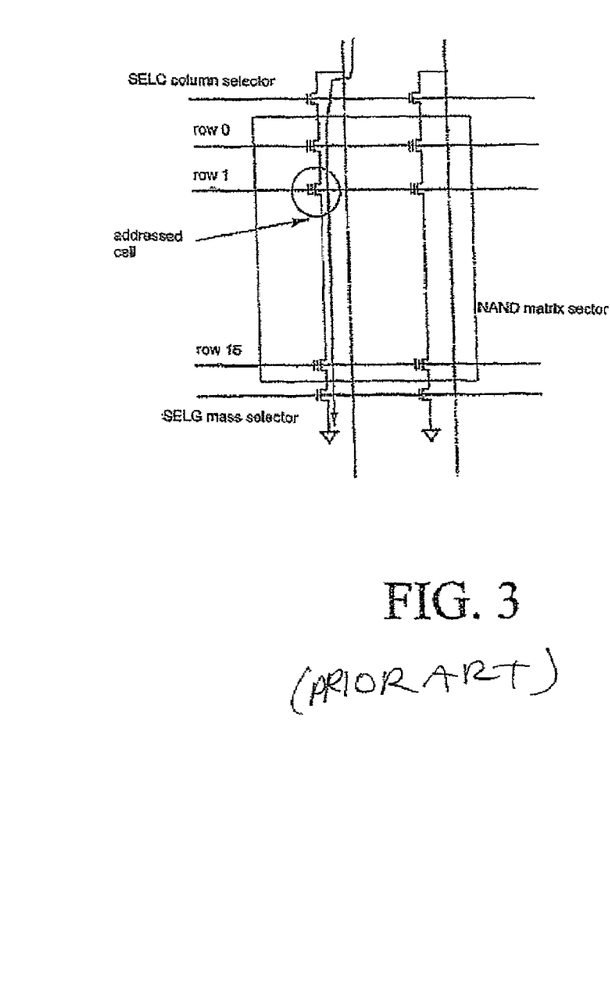
FIG. 3 shows a schematic view of an electronic memory device, in particular an EEPROM memory with a NAND architecture realized according to the prior art.

Instead in the case of the NAND architecture, shown for example in FIG. 3, the matrix structure results from the stacked organization of a series of cells, typically sixteen. The reading of the addressed cell involves all the cells of the stack or column. The cell to be read is biased with a higher gate than the others of the same stack, so that these are on while the addressed one, if virgin, will conduct current, if already programmed will not lead and thus operate as a switch to ground discriminating the information logic value.

The presence of such a high number of cells in series, to which the contribution of the selection pass transistors is to be added, implies a reading current being some orders of magnitude smaller than the one in the case of the NOR.

The reading operation thus occurs with a pre-charge and test step, an integration in time which addresses the problem of the measurement precision at the expense of the time necessary to perform it which is of 2-3 orders of magnitude greater than for the NOR case. FIG. 3 schematically illustrates this situation. This FIG. 3 shows in fact a traditional NAND structure wherein, inside the square, hereunder sixteen cells are schematically indicated forming a conventional stack of the NAND structure.

The other fundamental difference between the NOR and the NAND architecture is in the programming mode. In the NOR case the programming is obtained through the physical phenomenon of hot electrons (CHE) while erasing is through the phenomenon known as Fowler-Nordheim tunneling.

In the NAND case both the erasing and the programming occur through tunneling. The two physical phenomena have, as fundamental differences, the execution times and the current used.

In the case of the hot electrons the execution times are on the order of microseconds, while for the tunneling the execution times are on the order of milliseconds. On the contrary, the currents necessary in the case of hot electrons are on the order of tens of microamperes, while those necessary in the case of tunneling are on the order of picoAmperes and they are negligible for electronic devices.

The result of these differences is that the writing, in the NOR case, is faster but the number of cells which are to be programmed in parallel is at least an order of magnitude lower with respect to what can be done in the NAND case. To make an example: 256 cells can be programmed in parallel in a NOR memory, but as many as 4096 cells in the NAND case.

As a consequence, for memories of large size, where one can imagine that the writing operation is made of a byte only but of a lot of words together, the NAND approach is preferred.

This is why the applications are increasingly converging towards a distinction between:

memories for code storage: today densities around 256 Mb, typical reading speed of the NOR, used exactly either as memories from which a download operation of the code to be performed in RAM is carried out or even as execution memories, from here the need of a fast random access; and memories for data storage, with reading density typical of the NAND, used as data memory banks, for example of photographic cards, where the fast access is not so important since there is no execution of what is downloaded by the Flash but only of an edit on the suitable media; in the case of the photograph it can be the display of a photo on a PC monitor.

Finally, it is to be noted that the organization of the NAND allows a simplification of the erasing operation which is more granular with respect to what is possible for the NOR.

Having both typologies of memories, both the ones for the data storage and those for the code storage, is normally necessary inside an electronic system. Recently further new needs have arisen linked to the game and cellular phone markets, which include having high capacity memories to store any type of data, but also to store a video operative system, programs, results, etc.

To meet these needs the prior art has recently proposed devices defined as the MCP (Multi Chip Package) which incorporate, in a single package, different integrated electronic circuits, such as, for example, several types of memory circuits, for example one Flash memory of the NAND type, one of the NOR type, and a RAM memory.

All these memories are assembled and supplied in a single package so as to provide a single device simultaneously having the advantages of all the commercially available memories, for example, the density and storage capability as regards the NAND portion, or access speed and XIP possibility as regards to the NOR portion, and the random access as regards to the RAM portion.

For example, one of these devices is commercially known with the acronym OneNAND and is manufactured by the company Samsung. Another example of this kind of Multi Chip Package is the "DiskOnChip" of M-System.

Although advantageous under several aspects, and substantially meeting certain desires, these devices are not exempt from drawbacks. In the first place it is to be considered that the various memory circuits to be assembled in a single package are realized with different technologies, which compels addressing compatibility problems in the supplies on a single package and in the management of the input/output signals.

In the second place, the costs of the resulting package cannot significantly depart from the overall cost of the various components, since large scale economies cannot be exploited in realizing devices assembled with components being different from each other.

The problem is that of devising a new type of monolithically integrated electronic memory device, i.e. realized on a single chip, and having such structural and functional characteristics as to offer the same performances of a Multi Chip Package however overcoming the limits and drawbacks of that type of approach.

SUMMARY OF THE INVENTION

The solution idea underlying the present invention is that of realizing a memory integrated architecture of the NAND type and using a portion of the same to be dedicated to an architecture of the NOR or the like type, so that this memory portion shows, at least in the reading step, the performances, of the NOR memories.

On the basis of this solution idea the technical problem is solved by an electronic memory device as previously indicated and defined by claim 1 and the following ones.

BRIEF DESCRIPTION OF THE DRAWINGS

The characteristics and the advantages of the electronic memory device according to the invention will be apparent from the following description of an embodiment thereof given by way of indicative and non-limiting example with reference to the annexed drawings.

DETAILED DESCRIPTION OF THE PREFERRED EMBODIMENT

Figure 4:
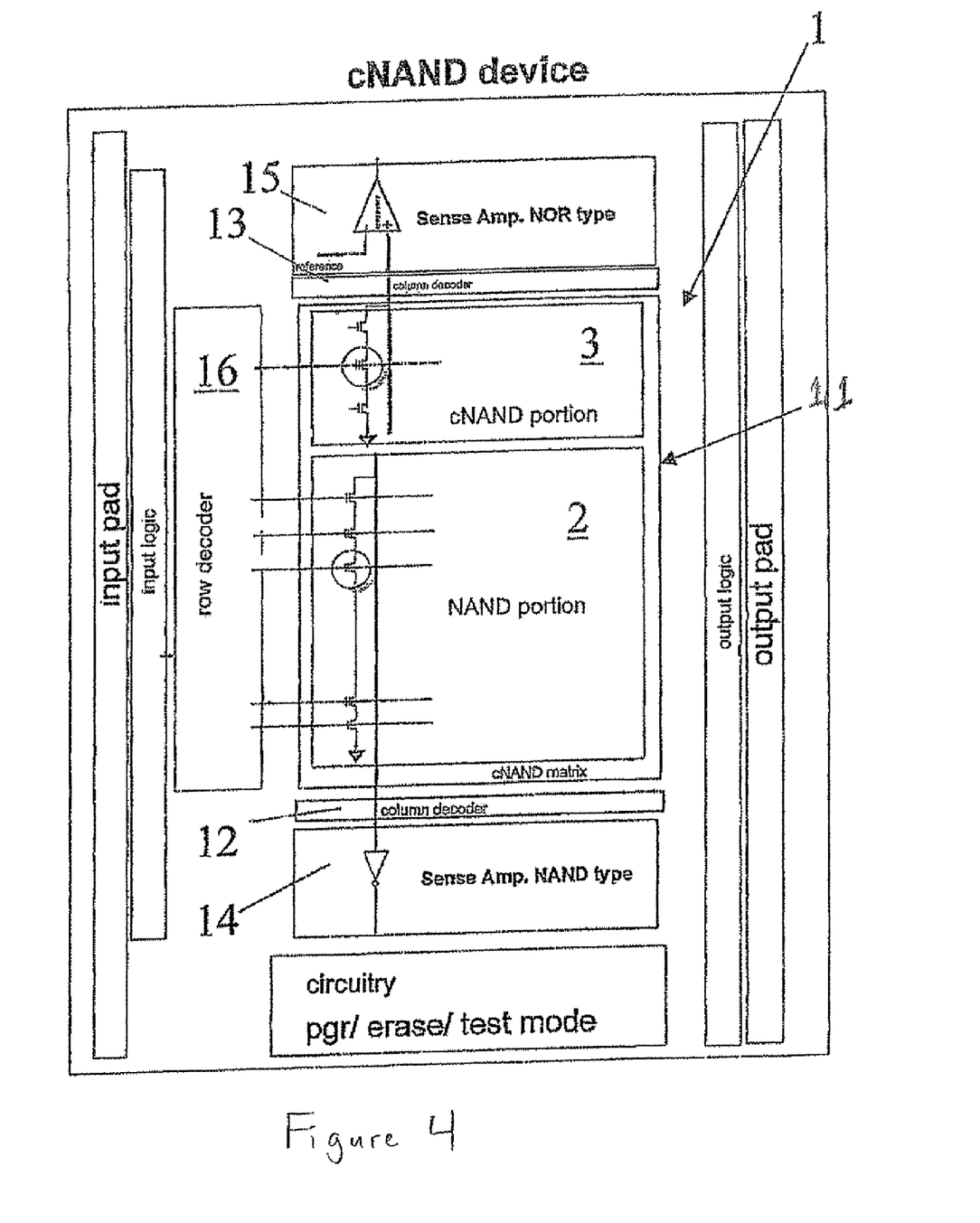
FIG. 4 shows a schematic view of an electronic memory device, in particular an EEPROM memory with a CNAND architecture realized according to the present invention.
Figure 6:
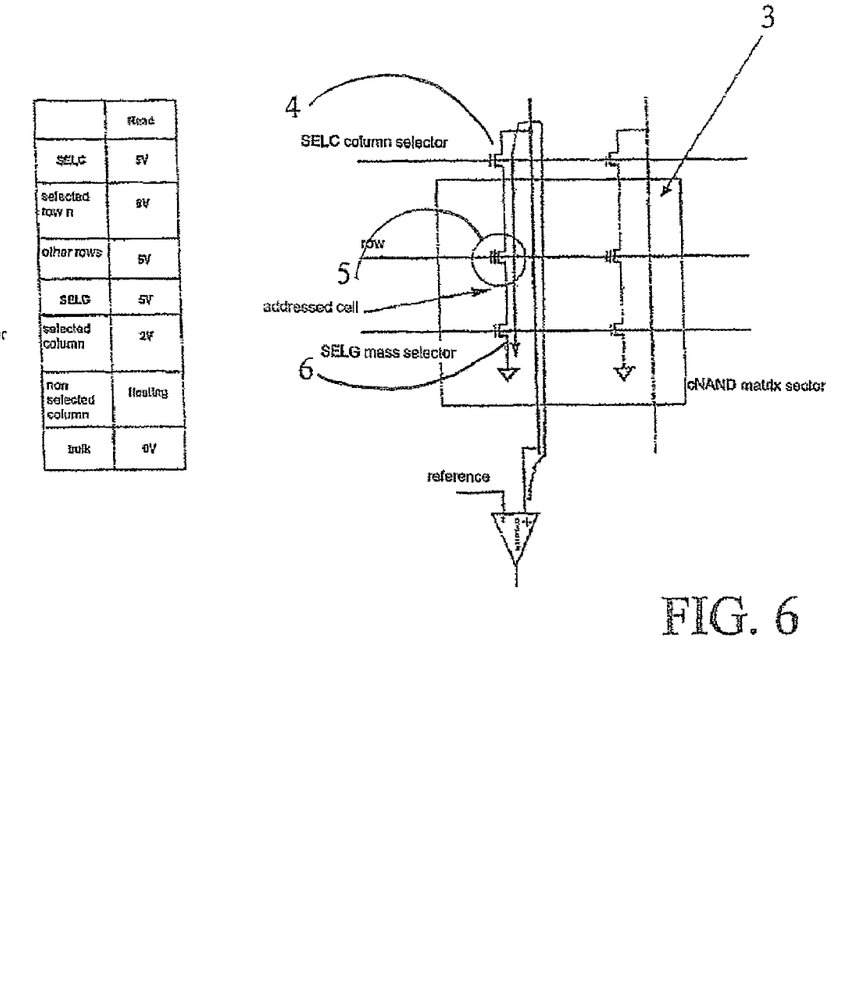
FIG. 6 shows a schematic view of a portion of an embodiment of the electronic memory device of FIG. 4.

With reference to these figures, and in particular to the examples of FIGS. 4 and 6, 1 globally and schematically indicates a portion of an electronic memory device realized according to the present invention and monolithically integrated on a semiconductor as an integrated circuit.

The device 1 is a memory of the Flash EEPROM type with architecture mainly of the NAND type. The device allows, at the cost of a slight modification of the array of a NAND memory, realizing, in a single chip, and thus with a single technology, a group of functions typical of different memories and until now only obtained by was of different types of devices. In other words, the device 1 is realized on a single chip, which integrates both the "hard disk" and boot ROM functions, avoiding resorting to the assembly of various components coming from different technologies, even if arranged on a same package.

The memory device provides the use, inside a memory matrix 2 with a NAND architecture, of a portion 3 of the same matrix to be dedicated to a NOR architecture or the like, so as to confer on this memory portion 3 performance, in the reading step, typical of NOR memories.

More particularly, the cNAND device shown in FIG. 4 comprises a matrix 11 realized in NAND technology but substantially divided into two portions 2 and 3. The Figure indicates: a portion 2 with a stack or column having sixteen cells and a portion 3 with a stack comprising a single cell.

Each portion 2 and 3 is associated with respective column decoders 12 and 13 and with the associated sense amplifiers 14, 15. It is to be noted that these decoders are specifically provided on opposite sides of the matrix 11 and that the sense amplifiers associated with the portion 3 are of the type used in the matrixes of the NOR type.

Advantageously, the two typologies of sense amplifiers indicated in FIG. 4 are the ones normally used for the NAND and NOR structures and they are mainly indicated to show the two different approaches made possible by the device, i.e.: pre-charge and evaluation for the NAND portion 2, continuous reading for the portion 3 of the NOR type.

A single row-decoding portion 16 is associated both with the matrix portion 2, and with the matrix portion 3. There are then conventional circuit blocks, which comprise a Flash memory, such as, for example, the input and output terminals, and the input and output logic portions.

Figure 5:
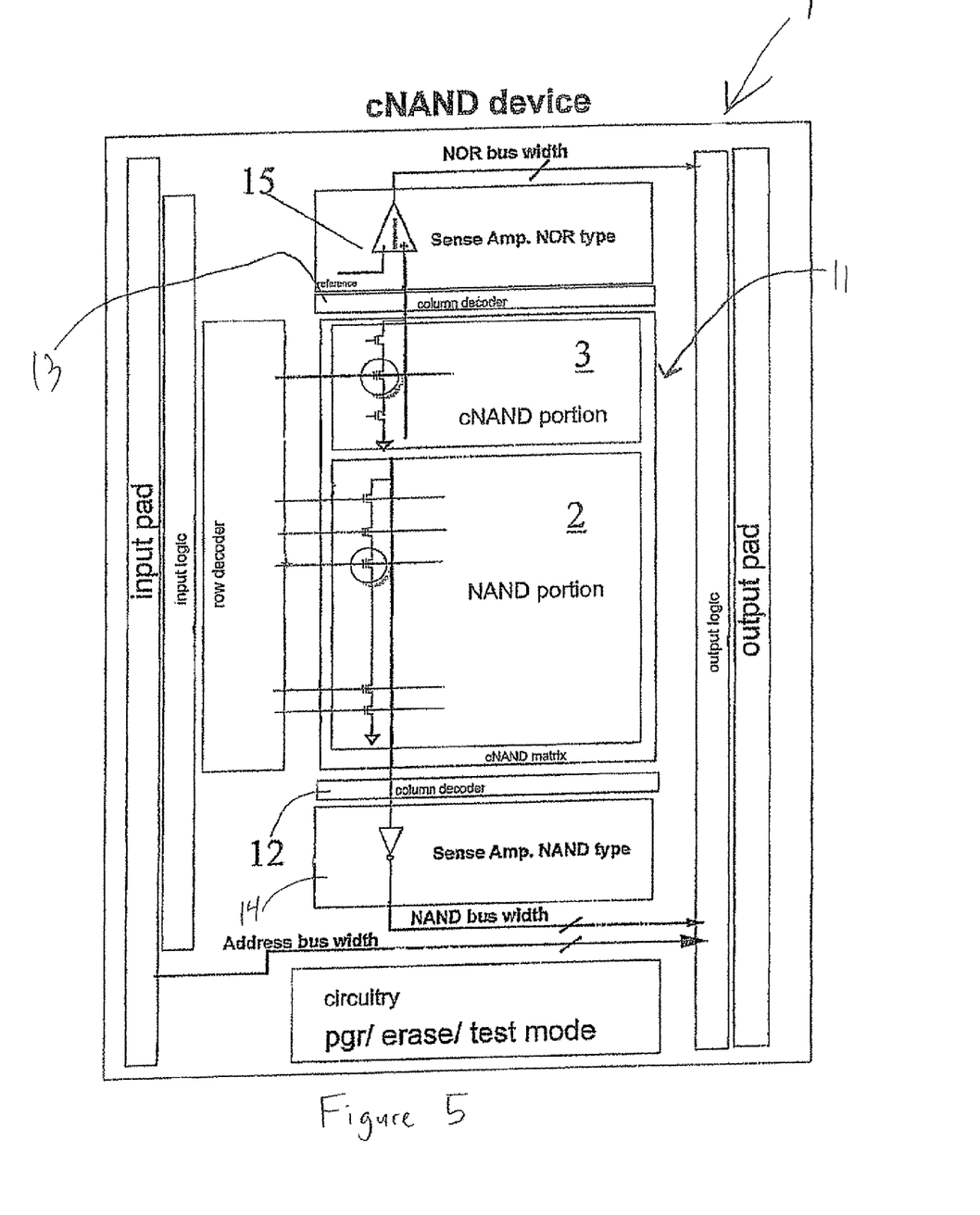
FIG. 5 shows a further schematic view of the electronic memory device of FIG. 4 where some paths concerning the modes of accessing data in the reading step are highlighted.

As shown in FIG. 5, the sensing operations occur with the use of a page buffer as regards the cNAND part. More particularly, in FIG. 5 it can be appreciated how the addresses drive the logic block for the output not of an array of the CNAND type but of a byte/word of the NOR type. In any case, the different access modes of the two portions 2 and 3 lead to choose a number of cells equal to the number of bit lines BL for the NAND portion 2 of the matrix 11.

It is to be noted that the two portions 2 and 3 have a different data storage capacity. In other words the cells in each block are of a different number in the two portions.

Moreover, another preferred characteristic is that the memory cell structure is identical in the two portions 2 and 3. As a consequence, the programming and erasing modes are the same, with the differences of row addressing (WL). The memory portion 3 can be used for the Code Storage and it will be called cNAND (codeNAND).

Advantageously, to optimize the constructive process and the present architecture of NAND architectures, preserving the programming and erasing structure for the cNAND portion 3 has been provided. In this way the connections to the decoding circuits for the erasing step are not modified, to bring the matrix WELL positive and the column decoding which, in this approach, does not have to be specifically designed to supply the current necessary for the programming in the hot electron mode. Moreover, the structure of the NAND matrix is not modified significantly since the drain contacts and the differentiated implants present for the phenomenon of hot electrons are not required.

FIG. 5 shows, in an enlargement and in greater detail, a representative embodiment of a first possible architecture wherein the sector of NAND matrix used to obtain the cNAND portion 3 has been reduced to a single cell 5. In this way, two selection transistors 4 and 6, already present in a traditional NAND structure, are maintained but the interested cell 5 is only one.

The current this cell 5 is able to absorb can be compared with the one of a NOR architecture and thus it is possible to realize a reading circuit similar to the NOR one: i.e., a circuit being differential and in static current with all the resulting speed advantages.

The annexed table I summarizes the differences between the addressed cell in a Flash sector with NOR architecture, in a sector with NAND architecture and in a sector with cNAND architecture.

TABLE 1

|  | NAND sector | NOR sector | CNAND sector |
| --- | --- | --- | --- |
| Program | Tunnel - pA/cell<br>Gate = 18 V<br>Source = 0<br>Drain = 0<br>Bulk = 0 | CHE - mA/cell<br>Gate = 10 V<br>Source = 0<br>Drain = 5 V<br>Bulk = 0 | Tunnel - pA/cell<br>Gate = 18 V<br>Source = 0<br>Drain = 0<br>Bulk = 0 |
| Erase | Tunnel - pA/cell<br>Gate = 18 V<br>Source = float<br>Drain = float<br>Bulk = 20 V | Tunnel - pA/cell<br>Gate = −10<br>Source = 8 V<br>Drain = float<br>Bulk = 8 V | Tunnel - pA/cell<br>Gate = 0<br>Source = float<br>Drain = float<br>Bulk = 20 V |
| Read | Pre-charge/<br>test<br>Gate = 5 V<br>Drain = 1 V<br>Source = 1 V −<br>$R_{stack} * I_{read}$ | Reading in<br>current<br>Gate = 5 V<br>Drain = 1 V<br>Source = 0 | Reading in<br>current<br>Gate = 5 V<br>Drain = 1 V<br>Source = 0 |

It is apparent that a cNAND portion 3 as the one here described is less competitive in terms of space from the point of view of the preservation of the NAND technological process. In fact, in FIG. 6 it is clear how the space dedicated to the column decoders becomes preponderant with respect to the space reserved for the memory cell 5. A successive step to optimize the circuit area occupation is that of increasing the number of the stacked cells.

The problem of the reading speed, as already seen, is due to the presence, in the NAND case, of sixteen cells in series which provide, during the reading step, such a high resistive step as not to make it possible to read the current as for the NOR architectures. A reading has thus been preferred including a pre-charge and of a test, as it is done for structures of the PLA type—a typical reading with charge integration.

Since on multilevel devices of the NOR type it is possible to distinguish different potential levels, although maintaining a reading speed lower than 100 ns and using a current reference of some microAmperes, for example, between 2 and 4 microampere, operating the reading on the cNAND portion 3 can be envisioned as if it were a structure of the multilevel type.

Figure 7:
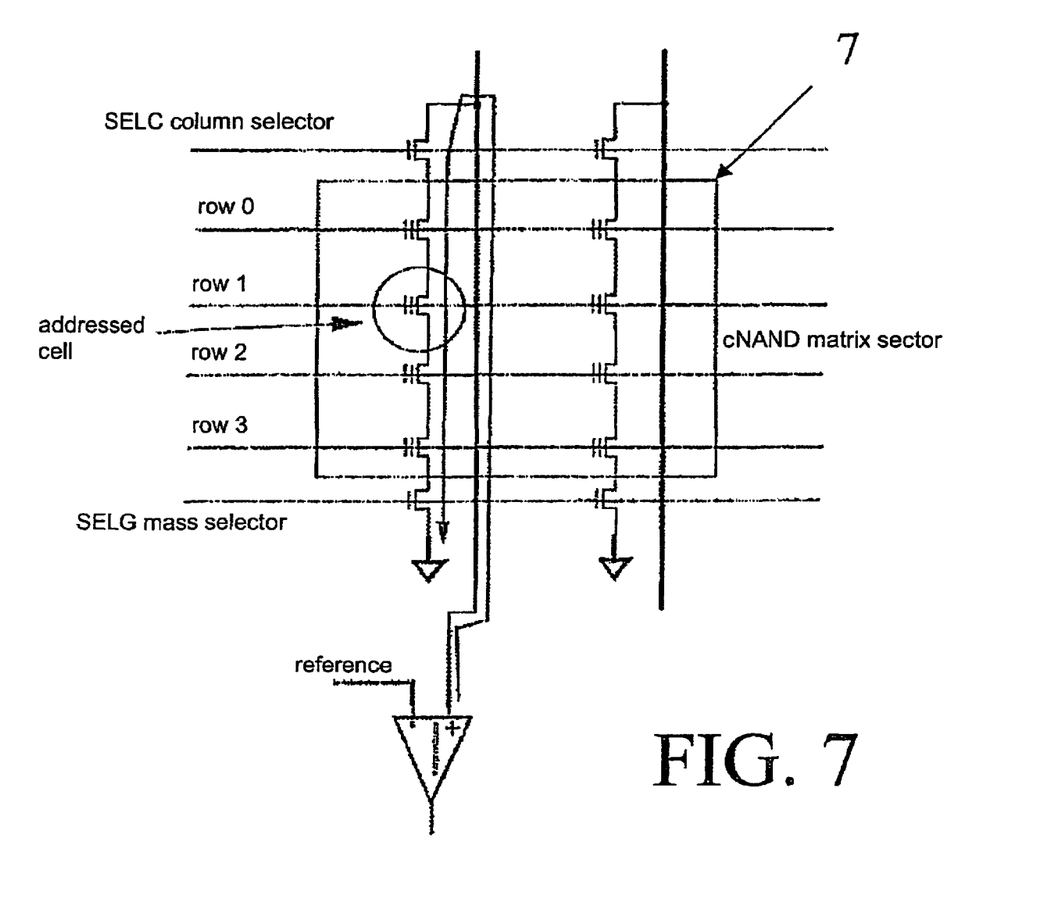
FIG. 7 shows a schematic view of a portion of the electronic memory device realized according to another embodiment of the present invention.

If it is envisioned that the cell 5 with the NAND architecture has a gain of 15 uA/V with a spread of 2V between the logic value "1" and the logic value "0", the difference current between the cell 5 and a reference current, supposed to be at half level, will be 15 uA. As a consequence, if one imagine that the impedance of each single cell is the same, one can think of reducing the stack of the cNAND sector to four cells with an available current exactly equal to the one already used in a NOR multilevel. FIG. 7 schematically shows this with the definition of a cNAND matrix portion 7 made of four rows.

To obtain the desired results in terms of reading speed, it is not enough to act only on the matrix structure, but it is also desired to also act on the row decoding and on the sensing part. The row decoding for a NOR structure represents one of the important aspects to obtain a good access speed in reading.

If one imagine using the approach of FIG. 6 with the cNAND sector made of a single cell, the row decoding to be used can be exactly the one used for a NOR structure, by even using a classic architecture, since the only thing to do is that of bringing, on the gate terminal of the cell 5, a positive voltage, both in the reading and in the writing step. Therefore, it is not necessary to use possible decoding structures of the modern generation, which allow bringing, on the gate terminal, also negative voltages. This represents an advantage since the same manufacturing process structure may be maintained, and thus the same NAND memories programming and erasing modes as well.

Instead, in case a minimum stack is to be maintained, as the one of FIG. 7, the row decoding should be realized like the one of a NOR structure wherein the non-selected rows should be, however, brought to a positive value during the reading step, as realized for a classic NAND architecture.

As regards the sensing circuitry, which is fundamental for the speed in reading, this should be realized like for the NOR structures, i.e. so that the cNAND sector portions are placed on the same side (with respect to the bit-lines) of the matrix, and so that the bit-line connection can go out from the matrix area and there is the same space to place the necessary sense amplifiers and the routing.

The output of the sense amplifiers dedicated to the cNAND sectors should converge with the outputs of the NAND senses amplifiers to reach common outputs. The output circuitry has been modified as shown in FIG. 5 to obtain a random access to the cNAND sectors.

As already seen, with reference to the example of FIG. 5, each portion 2 and 3 is associated with respective column decoders 12 and 13 and with the associated sense amplifiers 14, 15, but the sense amplifiers associated with the portion 3 are of the type used in the matrixes of the NOR type. The device thus makes two different approaches possible: pre-charge and test for the NAND portion 2, and continuous reading for the portion 3 of the NOR type.

The logic is realized so that once the address inside the cNAND sectors is known, the random access is automatic and, after an access time successive to the presentation of the addresses, data can be obtained on the outputs.

The memory device attains several advantages, the first one of which is given by the fact that in a single integrated circuit memory portions are housed having data storage capacity and associated data access speeds, but realized with the same technology. The device can be easily implemented since the construction of the matrix does not change for the NAND portion 2 and for the cNAND portion 3; only the number of the components of the respective stacks of cells changes.

That which is claimed is:

1. A memory device comprising:
    at least one memory matrix being organized in rows and columns of EEPROM NAND memory cells and comprising
        at least one first memory matrix portion, and a second memory matrix portion,
        said at least one first memory matrix portion having a different data storage capacity and a different access speed with respect to said second memory matrix portion; and
        a pair of sense amplifier circuits on opposite sides of said memory matrix, one sense amplifier circuit for said first memory matrix portion and the other sense amplifier circuit for said second memory matrix portion; and
    a column decoding circuit including sense amplifiers of a NOR type; and wherein said at least one first memory matrix portion is associated with said column decoding circuit.

2. The memory device according to claim 1 wherein said at least one first memory matrix portion comprises an effective NOR type memory.

3. The memory device according to claim 1 wherein a reading of said at least one first memory matrix portion comprises an electrical current reading.

4. The memory device according to claim 1 wherein said at least one first memory matrix portion comprises at least one memory cell.

5. The memory device according to claim 1 wherein said at least one first memory matrix portion comprises a stack of at least four memory cells.

6. The memory device according to claim 1 wherein said second memory matrix portion has a structure of a NAND type.

7. The memory device according to claim 6 wherein a number of memory cells in said at least one first memory matrix portion and in said second memory matrix portion are different.

8. The memory device according to claim 1 wherein said second memory matrix portion has a random access mode.

9. The memory device according to claim 1 wherein memory cells of said second memory matrix portion are read by at least a pre-charge step and a successive test step.

10. A memory device comprising:
    at least one memory matrix being organized in rows and columns of EEPROM NAND memory cells and comprising
        at least one first effective NOR type memory matrix portion, and
        a second memory matrix portion,
        said at least one first memory matrix portion having a different data storage capacity and a different access speed with respect to said second memory matrix portion; and
        a pair of sense amplifier circuits on opposite sides of said matrix, one sense amplifier circuit for said NOR type memory matrix portion and the other sense amplifier circuit for said second memory matrix portion; and
    at least one first memory matrix portion with a column decoding circuit including sense amplifiers of a NOR type.

11. The memory device according to claim 10 wherein a number of memory cells in said at least one first effective NOR type memory matrix portion and in said second memory matrix portion are different.

12. The memory device according to claim 10 wherein said second memory matrix portion has a random access mode.

13. A method of making a memory device comprising:
    forming at least one EEPROM NAND memory matrix comprising at least one first memory matrix portion, and a second memory matrix portion; and
    wherein the at least one first memory matrix portion has a different data storage capacity and a different access speed with respect to second memory matrix portion; and
    a pair of sense amplifier circuits on opposite sides of said memory matrix, one sense amplifier circuit for said first memory matrix portion and the other sense amplifier circuit for said second memory matrix portion.

14. The method according to claim 13 wherein the at least one first memory matrix portion comprises an effective NOR type memory.

15. The method according to claim 13 wherein the at least one first memory matrix portion comprises at least one memory cell.

16. The method according to claim 13 wherein the at least one first memory matrix portion comprises a stack of at least four memory cells.

17. The method according to claim 13 wherein the second memory matrix portion has a NAND type structure.

18. The method according to claim 13 wherein a number of memory cells in the at least one first memory matrix portion and in the second memory matrix portion are different.

* * * * *